United States Patent [19]

Dixon

[11] 4,062,632

[45] Dec. 13, 1977

[54] CONSTANT MODULATION INDEX TECHNIQUE FOR MEASURING THE DERIVATIVES OF DEVICE PARAMETERS

[75] Inventor: Richard Wayne Dixon, Bernardsville, N.J.

[73] Assignee: Bell Telephone Laboratories, Incorporated, Murray Hill, N.J.

[21] Appl. No.: 698,185

[22] Filed: June 21, 1976

[51] Int. Cl.$^2$ .................... G01N 21/22; G01R 21/14; G01R 19/00
[52] U.S. Cl. ........................... 356/72; 324/64; 324/158 D
[58] Field of Search ............... 356/72; 331/94.5 H; 324/62 R, 64, 715 N, 158 D

[56] References Cited

PUBLICATIONS

Eliseev et al., "Investigation of DC Junction Lasers" Physics of P-N Junctions & Semiconductor Devices, Edited by Y. V. Shmartsev (1971), pp. 150–159.
Mikkor et al., "Phonon & Plasmon Interactions in Metal-Semiconductor Tunneling Junctions" Phys. Rev. B, vol. 2, No. 6, 9-15-70, pp. 1875–1887.

*Primary Examiner*—John K. Corbin
*Assistant Examiner*—Wm. H. Punter
*Attorney, Agent, or Firm*—Michael J. Urbano

[57] ABSTRACT

Described is a technique for generating directly certain derivatives of device parameters by measuring the device response to ac modulation under conditions of constant modulation index. In particular, the technique as it applies to measuring directly $idF/di$ and $i^2d^2F/di^2$ for AlGaAs DH p-n junction lasers is described for two cases: where the generalized function F equals either voltage V across the laser or the light intensity output L of the laser, and $i$ equals current through the laser. For p-n junction lasers this technique permits measurement of the series resistance $R_s$, lasing current threshold $i_{th}$ and the exponential factor $\beta = q/nkT$.

10 Claims, 4 Drawing Figures

CONSTANT MODULATION INDEX TECHNIQUE FOR MEASURING THE DERIVATIVES OF DEVICE PARAMETERS

BACKGROUND OF THE INVENTION

This invention relates to a technique for measuring the derivatives of device parameters and, more particularly to measuring the first and second derivatives of the light-current-voltage characteristics of AlGaAs double heterostructure junction lasers.

Derivative techniques are employed in many fields of science and engineering. Reasons for their use range from the enhancement of signal-to-noise ratio, as in nuclear magnetic resonance and optical reflectivity investigations of band structure, to the convenience of direct measurement of dynamic transistor characteristics. Usually the techniques measure system response to a small ac modulation, often using phase detection for signal enhancement.

These techniques have recently been successfully applied to an analysis of the current-voltage characteristics of GaAs injection lasers. The first derivative $dV/di$ has been shown to be useful, both in homojunction and in double heterostructure lasers, for measuring the parameters entering the $i$-$V$ characteristic as well as for extracting lasing threshold and other features intimately related to the lasing process.

SUMMARY OF THE INVENTION

In accordance with one embodiment, my invention comprises a method for generating a product of an $n^{th}$ order derivative of a device parameter F with respect to current flowing through the device times the $n^{th}$ power of the current. For example, a dc current plus an ac component at frequency $\Omega$ are applied to a device, such as a junction laser, being tested. A voltage (V = F) produced in response to the flow of current through the device is phase detected in order to generate the coefficients of the Taylor series of that voltage at either the first harmonic ($\Omega$) or the second harmonic ($2\Omega$). It is a feature of our invention that the modulation index $m = i/\Delta i$ is maintained constant thereby allowing the direct measurement of both $idV/di$ and $i^2d^2V/di^2$. These current-derivative products, rather than the simple derivatives $dV/di$ and $d^2V/di^2$, are often desired quantities to measure. Thus, for junction lasers they provide a means to measure both the series resistance $R_s$, the lasing current threshold $i_{th}$ and the exponential factor $\beta = q/nkT$. Using this technique on GaAs-AlGaAs DH junction lasers, very strong second derivative signals near and above lasing threshold were observed. Additionally, derivatives of the light-current characteristic were displayed. These derivatives showed much sharper detail near lasing threshold (and when filamentary instabilities occurred) than did the light-current characteristic itself.

The technique is also useful for other devices in particular those for which the I-V characteristic exhibits exponential dependence over at least some current range. For example, the technique can be used to measure the series resistance and $\beta = q/nkT$ of silicon diodes.

BRIEF DESCRIPTION OF THE DRAWING

My invention, together with its various features and advantages, can be readily understood from the following more detailed description taken in conjunction with the accompanying drawing, in which.

DETAILED DESCRIPTION

Figure 1:
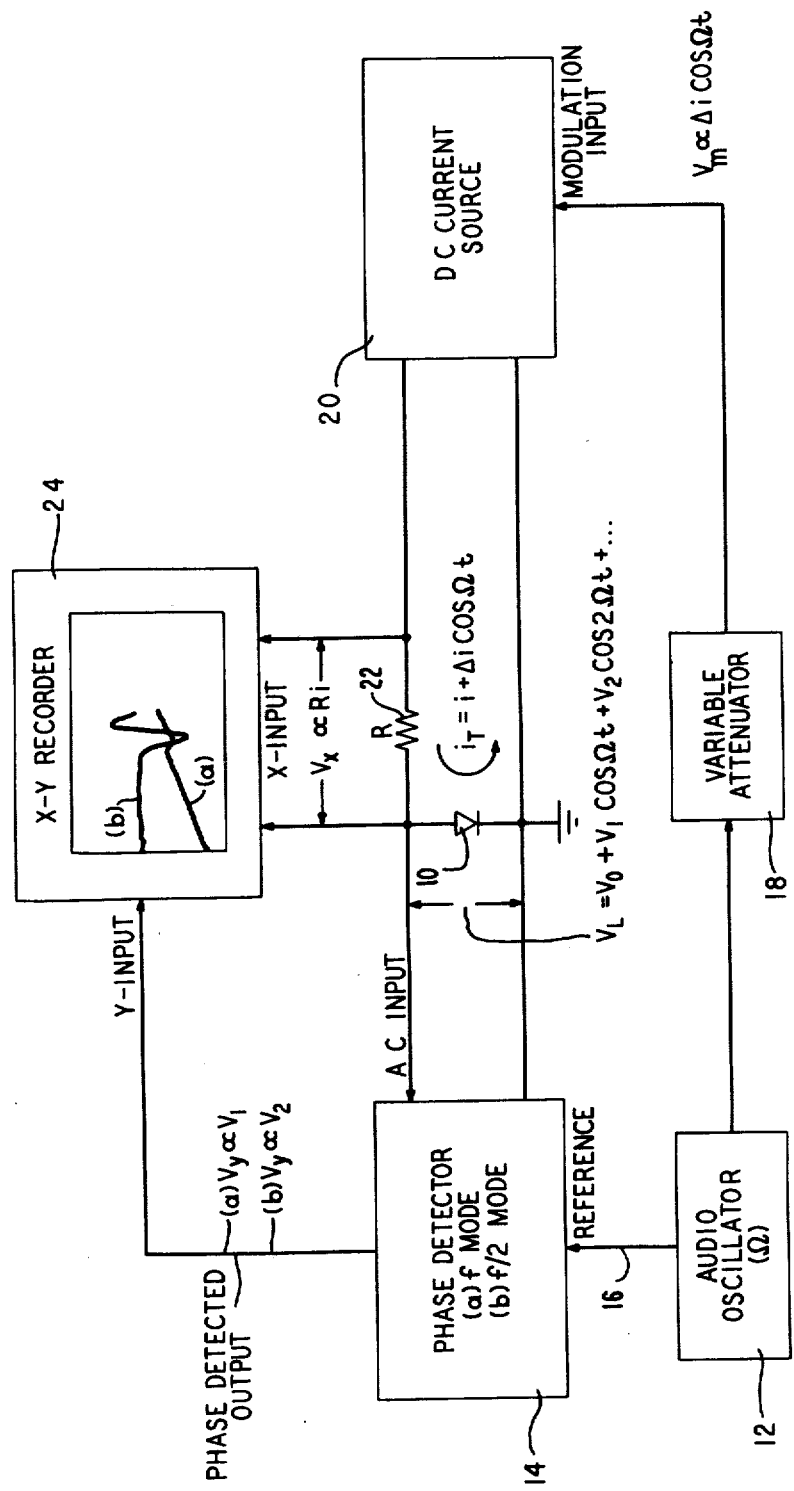
FIG. 1 is a schematic, block diagramatic view of apparatus used in accordance with one embodiment of my invention.

With reference now to FIG. 1, there is shown apparatus for measuring certain parameters of a device 10 being tested. The parameters are determined by generating directly particular current-derivative products; namely, $idF/di$ and $i^2d^2F/di^2$ where F is a generalized function that depends on the particular device under test. For clarity of description, however, it will be assumed in the immediately following discussion that the device 10 under test is a junction laser diode and that F = V, the voltage developed across the laser diode in response to a current $i_T$ flowing therethrough. However, as discussed later, F could also be L, the light intensity output of the laser.

The depicted apparatus comprises an oscillator 12 which generates a reference signal at a frequency $\Omega$ (illustratively an audio frequency of about 1–100kHz) on lead 16 connected to phase detector 14 (e.g., Princeton Applied Research Model PAR124). Oscillator 12 also generates on lead 16 a similar signal which is passed through a variable attenuator 18 to a dc current source 20 (e.g., a Hewlett-Packard Model HP6181B). Thus, the signal applied to current source 20 is a voltage $V_m$ proportional to $\Delta i \cos \Omega t$. Source 20 then adds a dc current component $i$ so that its output current $i_T$ is given by $$i_T = i + \Delta i \cos \Omega t. \qquad (1a)$$

The current $i_T$ passes through both the laser diode 10 and a resistor 22 which are connected in series with one another. The voltage developed across resistor 22 is applied to the x-input terminals of an x-y recorder 24. On the other hand, the voltage $V_L$ developed across laser diode 10 is applied to the input of phase detector 14.

The voltage $V_L$ can be expressed in terms of its harmonic components as follows $$V_L(t) = V_0 + V_1 \cos \Omega t + V_2 \cos 2\Omega t + \ldots \qquad (1b)$$

The phase detector 14 functions in two modes: (a) the f-mode for detection of $V_1$, the magnitude of the first harmonic component and (b) the f/2-mode for detection of $V_2$, the magnitude of the second harmonic component. Thus, the output of the phase detector is a voltage $V_y$ proportional to either $V_1$ or $V_2$ depending on the mode of operation. $V_y$ is applied to the y-input terminals of recorder 24.

It is a feature of my invention that the laser current is modulated at constant modulation index, $m = \Delta i/i =$ constant, rather than alternatives such as constant modulation amplitude, $\Delta i$. Accordingly, Eq. (1a) can be rewritten as $$i_T = i(1 + m \cos \Omega t). \tag{1c}$$

The advantage of using constant modulation index can be better appreciated if we consider a laser modeled as an ideal p-n junction in series with a resistance of value $R_s$. The current-voltage characteristic of this idealized device below threshold ($i < i_{th}$) would be $$i = i_o[e^{\beta(V - iR_s)} - 1] \tag{1d}$$

where conventionally $\beta = q/nkT$, $q$ is electronic charge, $k$ is Boltzmann's constant and T is absolute temperature. Solving Eq. (1d) for V, neglecting in this context both the $-1$ term and the current dependences of the parameters of Eq. (1d), and differentiating yields $$(dV/di) = (1/i\beta) + R_s \tag{2}$$

and $$(d^2V/di^2) = -1/\beta i^2. \tag{3}$$

For many purposes the preferred forms of Eqs. (2) and (3) are $$i(dv/di) = (1/\beta) + iR_s \tag{2a}$$

and $$i^2(d^2V/di^2) = -1/\beta, \tag{3a}$$

thus allowing the direct extraction of the parameters $\beta$ and $R_s$ without having to deal with the inverse current dependences. Also, the forms of Eq. (2a) and Eq. (3a) lend themselves to the investigation of the small $i - V$ changes which occur because of the optical-electrical interactions in the laser. It is worth emphasizing that direct measurements of the quantities $idV/di$ and $i^2d^2V/di^2$ are desired as opposed to the synthesis of these quantities from other measured parameters. This improves both the measurement accuracy and the experimental simplicity.

In order to see how this is possible consider that a current of the form of Eq. (1a) or Eq. (1c) is applied to the diode, the response voltage is expanded in a Taylor series as in Eq. (1b) and coefficients $V_1$ and $V_2$ in $\Omega$ and $2\Omega$ collected. The result is $$V_1(\Omega) = mi(dV/di) \tag{4}$$

and $$V_2(2\Omega) = (m/2)^2 i^2 d^2V/di^2, \tag{5}$$

if only lowest order terms are retained. Thus, when the laser is modulated using a constant modulation index in accordance with my invention, the desired quantities may be obtained directly at the frequencies $\Omega$ and $2\Omega$; that is, $V_1$ and $V_2$ are directly proportional to $idV/di$ and $i^2d^2V/di^2$ which in turn give $\beta$ and $R_s$ by virtue of Eq. (2a) and Eq. (3a).

Figure 2:
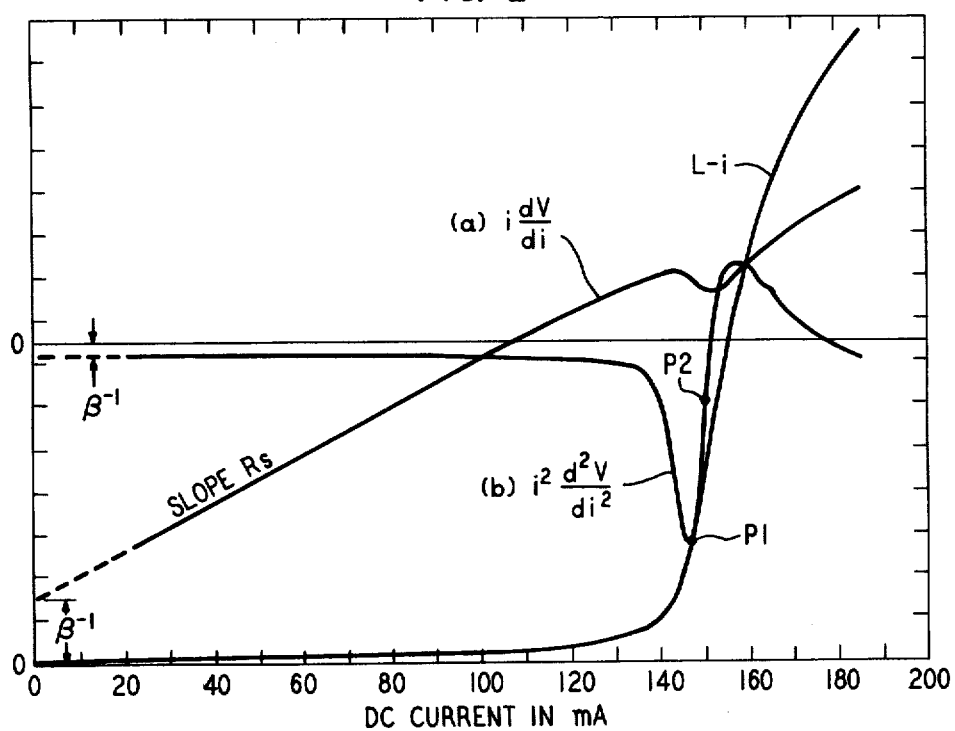
FIG. 2 is a graph showing typical first harmonic ($idV/di$) and second harmonic ($i^2d^2V/di^2$) voltage responses as a function of laser current measured using the apparatus of FIG. 1.

In operation, when the phase detector 14 is tuned to the modulation frequency $\Omega$ [f-mode (a) in FIG. 1] laser response voltages like that labeled $idV/di$ in FIG. 2 are obtained. This curve has characteristics which include a y-axis intercept [equal to $1/\beta$ on the simple theory, Eq. (2a)], the slope (proportional to series resistance $R_s$ on the simple theory), and an indication of voltage saturation near lasing threshold. System response was checked both with resistors and with a S$i$ diode replacing the laser, and the known values of R and $\beta$ were reproduced very well. The signal $V_1(\Omega)$ was also confirmed to be linearly proportional to $m$ as expected from Eq. (4). Many different lasers were measured and their results seemed generally similar although major deviations from slope linearity below threshold were sometimes observed, as were significant differences among the forms of the $idV/di$ responses near and above lasing threshold. Voltage saturation was almost never complete, and filaments resulted in even more complex $idV/di$ responses. The experimental technique, however, is accurate, easily calibrated, and simple to use.

An important advantage of this technique is that it can also be used to measure the voltage response at frequency $2\Omega$ and thus to obtain the second derivative $i^2d^2V/di^2$. Detection at frequency $2\Omega$ was accomplished by operating the phase detector 14 in the $f/2$-mode [mode (b) in FIG. 1]. In this mode the instrument produces an internal reference frequency at exactly twice the frequency of the externally applied reference, thus making the detection system sensitive to $V_2(2\Omega)$.

Trace (b) of FIG. 2 shows a typical signal detected with the system operated in the $f/2$-mode. The signal-to-noise ratio was very large. The initial shape (with current increasing) was quite reproducible from laser-to-laser while the structure at higher currents is laser dependent. The initial negative offset is proportional to $1/\beta$ on the simple theory [Eq. (3a)]. Again the signal appeared greatly affected by filamentary laser operation. When the laser was shorted or replaced by a resistance, a horizontal straight line resulted, as expected. As an additional check, the dependence of $V_2(2\Omega)$ on modulation index was measured below threshold over the range $0 \leq m \leq 0.10$ and confirmed to be accurately $m^2$, consistent with theory [Eq. (5)]. Thus, there is little indication of feedthrough from the first harmonic, or of harmonic distortion of the modulating frequency, affecting the detected voltage at the second harmonic.

Note also that in the vicinity of the lasing threshold the second derivative signal is strongly peaked. Consequently, the inflection point P1 or some intermediate point P2 can be used to measure $i_{th}$. An advantage of this technique resides in the fact that it is a totally electrical procedure, i.e., the light output need not be monitored. One application, therefore, is in controlling the deposition of reflections or anti-reflection coatings on the laser mirrors. Such depositions typically take place with the laser mounted in a vacuum chamber where electrical access to the laser is more readily made than optical access.

Figure 3:
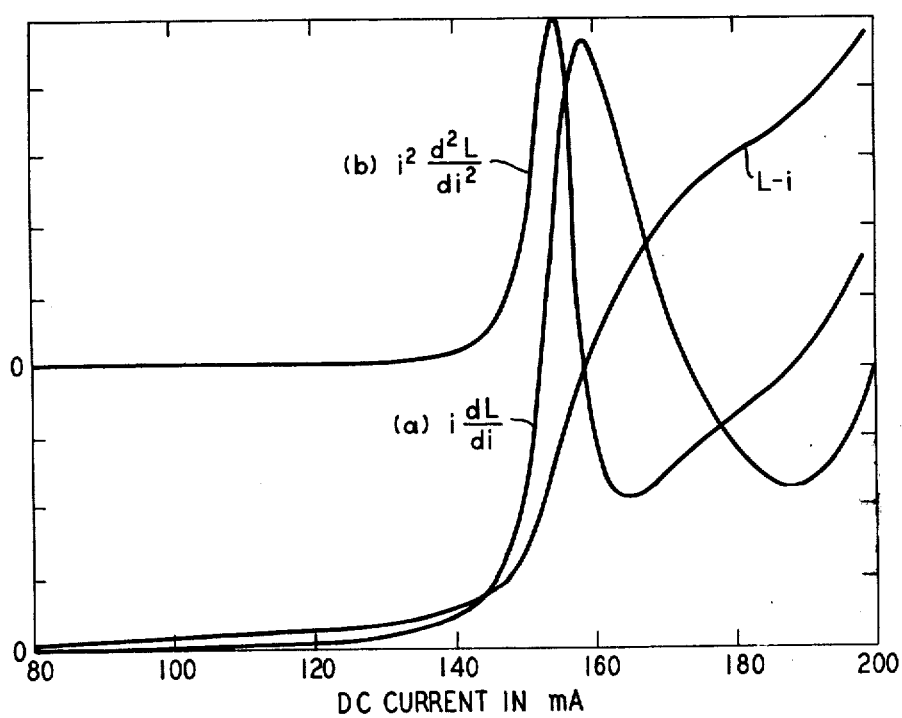
FIG. 3 is a graph showing typical first harmonic ($idL/di$) and second harmonic ($i^2d^2L/di^2$) light intensity responses as a function of laser current measured using a slightly modified version of the apparatus of FIG. 1.
Figure 4:
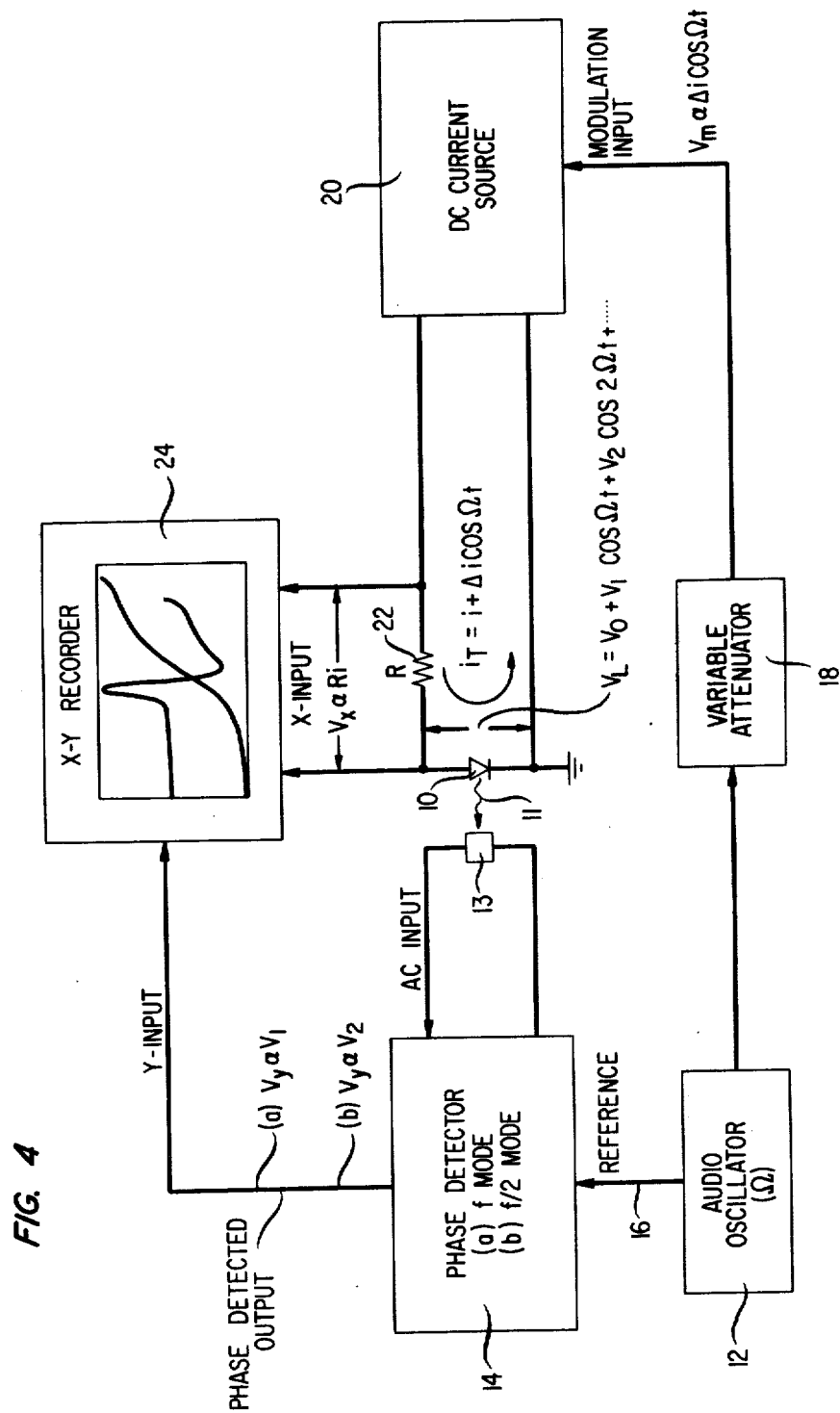
FIG. 4 corresponds to FIG. 1 but is adapted to measure derivatives of light intensity L.

Using the apparatus depicted in FIG. 1, the derivatives $idL/di$ and $i^2d^2L/di^2$ for light intensty L were also directly obtained. As shown in FIG. 4, this was accomplished by placing the laser 10 in a holder (not shown) in which the optical emission 11 from each mirror face was separately monitored with Si photodiodes 13. The photodiode current (or a voltage proportional thereto) then served as the input to the phase detector 14. This application of derivative techniques may prove to be a useful adjunct to L($i$) measurements, not only for the purpose of providing accurate measurement of parameters such as differential quantum efficiency ($\alpha$ $dL/di$) but also for the investigation of filaments and other spatial inhomogeneities in the laser cavity. Typical derivative signal responses are shown in FIG. 3 along with a light-output-current characteristic measured in the same apparatus. A device with significant curvature in the $L - i$ was used as an example in order to illustrate the enhancement of such slope changes using the derivatives. As expected from earlier results, the emission from the two laser mirrors was often unsymmetric and was usually very unsymmetric when $L-i$ kinks were present. These kinks are thought to be associated with spatial inhomogeneities in the laser cavity. This nonsymmetry was also present in the light-current derivatives. Very sharp derivative structure was seen near the light-current kinks. These observations strongly suggest that light-current derivatives, either alone or in combination with voltage derivatives, will prove very useful for investigating light-current nonlinearities, spatial inhomogeneities, and their relationship in injection lasers.

It is to be understood that the above-described arrangements are merely illustrative of the many possible specific embodiments which can be devised to represent application of the principles of our invention. Numerous and varied other arragements can be devised in accordance with these principles by those skilled in the art without departing from the spirit and scope of the invention.

In particular, neglecting the $-1$ term in Eq. (1d) is not thought to be significant. However, although the assumptions that $\beta$, R, and $i_o$ are independent of current is a good first order approximation, if $\beta$ does in fact depend on current through a parameter $n$, the first order correction to the derived value of $n$ is $$\alpha n(i) = (q/kT)(V-iR_s) \, i/n \, dn/di. \quad (6)$$

Equivalently one finds instead of Eq. (2a)

$$i \, dV/di = (1/\beta) + V \, i/n \, dn/di + iR_s(1 - i/n \, dn/di) \cdot (2a')$$

Thus both of the derived parameters $\beta$ and $R_s$ are sensitive to the assumption of $\beta$ independent of current.

Analogous comments apply in the second derivative case where Eq. (3a) is replaced by $$i^2 \, d^2V/di^2 = -1/\beta(1 - 2(i/n \, dn/di) + (V-iR_s) \, i^2/n \, d^2n/di^2 \cdot (3a')$$

Expressions applicable when R and $i_o$ are current dependent are similarly derived in a straightforward fashion well known to those skilled in the art.

What is claimed is:

1. A method for generating a product of an $n^{th}$ order derivative of a device parameter F with respect to current flowing through the device times the $n^{th}$ power of the current comprising the steps of:
   a. applying to said device a variable current which has both a d.c. component $i$ and an a.c. component $\Delta i$ which oscillates at a frequency $\Omega$,
   b. maintaining substantially constant the ratio $i/\Delta i$,
   c. detecting a signal produced in response to the flow of said current through said device, and
   d. extracting from said signal the frequency component thereof which corresponds to the desired current-derivative product.

2. A method according to claim 1 wherein said device has an exponential relationship between current and voltage over at least some current range.

3. A method according to claim 1 for generating the current-derivative product, $idV/di$, where $F = V$ is the voltage developed across said device in response to said current $i$ flowing therethough, and wherein in step (c) said voltage, which corresponds to said signal, is phase detected to extract in step (d) the magnitude of the first harmonic frequency component.

4. A method according to claim 3 including the step of generating a display of the magnitude of said first harmonic component versus current $i$.

5. A method according to claim 4 wherein said device is a p-n junction laser, and including the step of determining the series resistance $R_s$ of said laser from the slope of said display and $\beta = q/nkT$ from the ordinate intercept of said display.

6. A method according to claim 1 for generating the current-derivative product, $i^2d^2V/di^2$, where $F = V$ is the voltage developed across said device in response to said current $i$ flowing therethrough, and wherein the step (c) said voltage, which corresponds to said signal, is phase detected to extract in step (d) the magnitude of the second harmonic frequency component.

7. A method according to claim 6 including the step of generating a display of the magnitude of said second harmonic component versus current $i$.

8. A method according to claim 7 wherein said device is a p-n junction laser, and including the step of determining $\beta = q/nkT$ from the ordinate intercept of said display and the current threshold for lasing from that portion of said display which exhibits a relatively sharp peak.

9. A method according to claim 1 for generating the current-derivative product, $idL/di$, where said device is a p-n junction laser and $F = L$ is the light intensity output of said laser, including the steps of
   converting said light output to the signal of step (c), and
   in step (d) extracting from said signal the magnitude of the first harmonic frequency component.

10. A method according to claim 1 for generating the current-derivative product, $i^2d^2L/di^2$, where said device is a p-n junction laser and $F = L$ is the light intensity output of said laser, including the steps of
    converting said light output to the signal of step (c), and
    in step (d) extracting from said signal the magnitude of the second harmonic frequency component.

* * * * *